United States Patent [19]

Cox et al.

[11] 4,272,348
[45] Jun. 9, 1981

[54] BUBBLE DEVICE FABRICATION

[75] Inventors: Daniel E. Cox, Ossining, N.Y.; Susan M. Kane, New Fairfield, Conn.; John V. Powers, Shenorock, N.Y.

[73] Assignee: International Business Machines Corporation, Armonk, N.Y.

[21] Appl. No.: 962,251

[22] Filed: Nov. 20, 1978

[51] Int. Cl.³ .................... C23C 15/00; C23F 1/02
[52] U.S. Cl. .................... 204/192 E; 204/192 EC; 156/643; 156/652; 156/656; 156/661.1; 427/127; 427/130; 427/131; 427/132; 29/604
[58] Field of Search .................... 204/192 E, 192 EC; 156/643, 646, 652, 656, 657, 659, 660, 661; 427/127, 128, 129, 130, 131, 132, 43; 29/604

[56] References Cited

U.S. PATENT DOCUMENTS

| | | | |
|---|---|---|---|
| 3,957,552 | 5/1976 | Ahn et al. | 427/43 X |
| 4,098,917 | 4/1978 | Bullock et al. | 427/36 |
| 4,172,758 | 10/1979 | Bailey et al. | 156/643 |

OTHER PUBLICATIONS

H. W. Lehmann et al., Applied Physics Letters, 32(3), Feb. 1, 1978, p. 163.
R. F. Bailey et al., Solid State Technology, Sep. 1976, p. 74.
E. G. Spencer et al., The Journal of Vacuum Science and Technology, vol. 8, No. 5, pp. S52–S70, 1971.
M. Cantagrel et al., Journal of Materials Science, vol. 8, pp. 1711–1716, 1973.
G. Gloersen, J. Vac. Sci. Technol., vol. 12, No. 1, Jan.-/Feb. 1975, pp. 28–35.

*Primary Examiner*—Howard S. Williams
*Assistant Examiner*—William Leader
*Attorney, Agent, or Firm*—Jackson E. Stanland

[57] ABSTRACT

A single level masking process for producing microelectronic structures, such as magnetic bubble domain devices, which require very fine line widths. This is a subtractive dry process using a very thin, additively plated mask in order to obtain optimum lithographic resolution. Use of the very thin plated mask eliminates the need for a thick resist layer which would adversely affect resolution. In one example, a double layer metallurgy comprising a conductor layer (such as Au) and an overlying magnetically soft layer (such as NiFe) is patterned using a thin Ti (or Cr) mask. The Ti mask is subtractively patterned using a NiFe mask which is itself patterned by electroplating through a thin resist layer. The double layer NiFe/Au structure is patterned to provide devices having high aspect ratio, good pattern acuity, and uniform thicknesses, where the minimum feature is 1 micron or less.

17 Claims, 8 Drawing Figures

BUBBLE DEVICE FABRICATION

DESCRIPTION

1. Technical Field

This invention relates to processes for producing microelectronic structures, and more particularly to a process for producing magnetic bubble domain devices where the minimum device feature is not in excess of 1.0 micron. This is a dry subtractive process using a single critical masking step wherein the need for thick resist layers is eliminated.

2. Background Art

In the fabrication of microelectronic structures where extremely fine line patterns have to be produced, it is difficult to provide either an additive or subtractive fabrication process which will provide high quality device structures. In particular, as magnetic bubble devices become smaller due to the use of even smaller magnetic bubble domains, it is difficult to provide an overlay fabrication process which will produce devices having high aspect ratio and good pattern acuity especially in those magnetic bubble domain devices which have double metallization layers. For example, a conductor layer (such as gold, or Al-Cu) is often required close to the magnetic bubble domain layer in order to provide current carrying functions such as those used for transfer of magnetic bubbles from one path to another. An overlying layer of magnetically soft material, such as NiFe, etc., is patterned to provide the propagation elements for movement of the bubbles in response to the reorientation of a magnetic field in the plane of the NiFe layer. The conductor layer is approximately 2,000 Angstroms in thickness while the NiFe layer is approximately 3,000 Angstroms thick.

Conventional techniques for producing magnetic bubble devices using only a single masking level require thick resist layers. For example, in an additive process wherein NiFe propagation elements are electroplated through a resist mask, the resist must be at least as thick as the required propagation elements. This is typically 3,000–5,000 Angstroms.

In a subtractive process for producing magnetic bubble domain devices, a continuous layer of magnetically soft material having a continuous conductor layer thereunder, is patterned by ion milling using a resist mask. In this situation, the resist mask must approach 1 micron in thickness since it etches more quickly than the underlying metal layers. Even if the resist layer is to be used as a secondary mask with which to form a metal ion milling mask by another subtractive process such as plasma etching, the resist layer still needs to be on the order of 4,000–5,000 Angstroms thick. When direct electron beam writing is used in both of these subtractive processes, the resist layer must comprise a negative resist (i.e., one in which solubility decreases in exposed regions of the resist layer) rather than a positive resist layer (i.e., one in which resist solubility increases in the areas which are exposed). The use of negative resist layers is disadvantageous, since they do not have the resolving power of positive resist layers and, additionally, experience problems such as swelling, etc. in use.

In order to make fine line patterns having the dimensions described previously, it is generally necessary to use lithographic exposure by a technique such as electron beam writing. However, optimum resolution by these lithography exposure techniques requires that the resist layer be as thin as possible. Thick resist layers tend to scatter the incoming electromagnetic radiation by phenomena such as backscattering and secondary electron emission and therefore produce patterns having poor resolution. Further, when a resist pattern is used as an etching mask, the sides of the resist layer often become beveled, leading to etched patterns having side walls which are faceted rather than straight. Generally, resist layers used for subtractive processes are thicker than those used in additive processes, because the resist layer etches faster than the underlying metallic layers which are to be patterned through the resist layer.

In the practice of the present invention, it is important to avoid the need for thick resist layers and, additionally, to provide a subtractive process in which negative resists are not required. This has been achieved by the present subtractive process which uses a single, very thin resist layer having a thickness on the order of 1,000 Angstroms. This is a positive resist layer which is used to provide an additively plated metal masking layer, which in turn is used to pattern another underlying metallic layer. In the further practice of the present method, high quality patterns having high aspect ratios and good pattern acuity are provided using materials having selected relative etch rates. The etch rates of these masking materials, relative to the etch rates of resist layers and the device metallurgy layers, allow a device to be fabricated without the need for thick resist layers and negative resist layers.

Accordingly, it is a primary object of the present invention to provide an improved fabrication technique for making magnetic bubble domain devices using only a single critically aligned masking level.

It is another object of the present invention to provide a fabrication process for making magnetic bubble devices having minimum device features of one micron or less, in a technique which does not require the use of high aspect ratio resist layers.

It is another object of the present invention to pattern multiple metallization layers in devices where the minimum features are about one micron or less, while providing high aspect ratios and good pattern acuity.

It is still another object of the present invention to provide a single level masking technique for producing magnetic bubble domain devices using only a thin layer of positive resist.

It is a further object of the present invention to optimize lithographic resolution in a fabrication technique used to pattern metallization layers to produce very fine line structures.

It is a further object of the present invention to provide fine line patterns of double layer metallization which have high aspect ratios and good pattern acuity, using a fabrication process which is capable of using very thin resist layers.

It is a further object of the present invention to provide a single level masking technique for fabrication of magnetic bubble domain devices which can be used with electron beam, x-ray, or optical resist layers.

BRIEF SUMMARY OF THE INVENTION

In the practice of this invention, magnetic bubble domain devices are provided without the need for thick resist layers. This is a subtractive fabrication process in which double metallization layers are patterned by ion milling using a metal mask which is very thin. The metal mask is comprised of a material which etches at a rate much less than the rate at which the device metallization layers etch and which at the same time does not exhibit faceting or preferential etching. Ti is a particularly good material for the etching of a double layer structure comprising a NiFe layer and an Au layer. An alternative masking material is Cr. Of course, if the device structure comprises layers other than NiFe and Au, other masking materials can be chosen in accordance with the teachings of this invention.

The metal masking layer is patterned by reactive ion etching using a thin electroplated mask. The electroplated mask is a metal which is plated through a thin patterned layer of positive resist.

Thus, a complete subtractive process for fabrication of bubble domain devices is provided which does not require the use of negative resists or resist layers which are excessively thick. A first thin metal mask is electroplated through a thin patterned positive resist layer, and this first mask is used to pattern a second metal mask. The second metal mask is used to pattern the bubble device metallurgy, which is, in most cases, a double layer comprising a magnetic layer over a non-magnetic conductor layer.

These and other objects, features and advantages will be more apparent from the following more particular description of the preferred embodiments.

DETAILED DESCRIPTION OF THE PREFERRED EMBODIMENTS

DEVICE STRUCTURE

Figure 1:
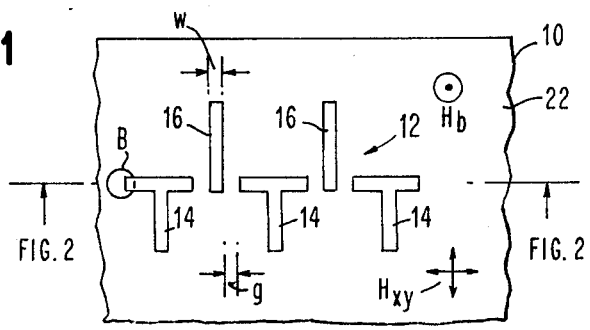
FIG. 1 is a top view of a magnetic bubble domain device showing a typical bubble propagation pattern.
Figure 2:
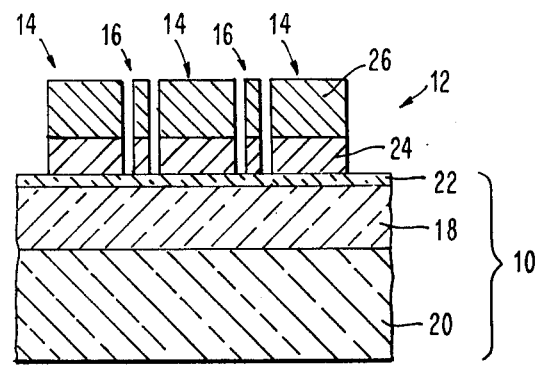
FIG. 2 is a cross-sectional view of the structure of FIG. 1, taken along the line 2—2.

FIGS. 1 and 2 illustrate two views of a magnetic bubble domain device including double layer metallurgy. FIG. 1 is a top view in which a substrate 10 comprising a magnetic bubble domain film has a pattern 12 of T-bars 14 and I-bars 16 thereover. This type of pattern is well known in the art for moving magnetic bubble domains B in response to the reorientation of a magnetic field $H_{xy}$ in the plane of the substrate 10. The diameter of the bubble domains is stabilized by the perpendicular bias field $H_b$.

The propagation pattern 12 of FIG. 1 is comprised of propagation elements 14 and 16 which are separated from one another. The width (w) of these elements and the gap (g) between elements are chosen in accordance with the diameter of the bubble domains B. Generally, the gap (g) will be less than about one-third of the bubble diameter while the linewidth (w) will be about one-half of the bubble diameter. As an example, for bubble domains having a diameter of 1 micron, (w) will be about 0.5 micron and (g) will be about 0.25 micron. As is well known in the art, the restraints on the gap (g) are greater with a TI-bar propagation pattern than with a propagation pattern comprising C-bars or asymmetric half-disks. The principles of the present invention are applicable to a single level masking technique for producing any type of propagation pattern or other device pattern.

FIG. 2 is a side view of the structure of FIG. 1, taken along the line 2—2. The illustrated structure comprises double levels of metallurgy, one of which is a magnetically soft material while the other is a non-magnetic, electrically conductive material. The substrate 10 is generally comprised of the bubble domain storage film 18, which has been grown or deposited on a substrate 20. In the case of a garnet bubble domain film, the substrate 20 is a non-magnetic garnet suitably chosen so that storage film 18 can be epitaxially grown thereon. An electrically insulating spacer layer 22 is generally provided on the magnetic bubble film 18. This spacer layer is used to space the propagation elements from the garnet storage film and also to protect the surface of the storage film during overlay processing.

The device structure comprising the propagation pattern 12 is a double layer structure, layer 24 being a non-magnetic, electrically conductive material, while layer 26 is a magnetically soft material. Gold is a suitable material for layer 24, while NiFe is a suitable material for layer 26. As is apparent, layers 24 and 26 are patterned to provide the propagation pattern 12. Thus, the T-bars 14 and I-bars 16 are double layer structures.

As is known in the art, it is often desirable to have the electrically conductive layer used for current carrying functions located closer to the magnetic bubble domain layer than the magnetically soft elements used to provide the propagation elements. The presence of the electrically conductive layer 24 under the propagation elements does not adversely affect the operation of the propagation patterns in parts of the magnetic bubble domain chip where current carrying functions are not required.

Provision of patterns such as propagation pattern 12 is very difficult when very fine linewidths and small gaps are necessary. This is particularly so when double metallization layers are to be patterned to provide very sharp side walls and good pattern acuity. That is, as the size of the gap decreases it is more difficult to provide double layer patterns having high aspect ratios.

In the prior art, magnetic bubble domain chips are provided using either additive processes or subtractive processes. Both of these processes generally require the use of thick resist layers, which is a serious disadvantage. The process illustrated by FIGS. 3A-3F provides a complete magnetic bubble domain chip without the need for thick resist layers.

OVERLAY PROCESSING (FIGS. 3A-3F)

In FIGS. 3A-3F, the substrate 20 for the bubble domain film is not shown for ease of illustration. The same reference numerals will be used for the bubble domain film (18) and the insulating spacer layer (22).

Figure 3A:
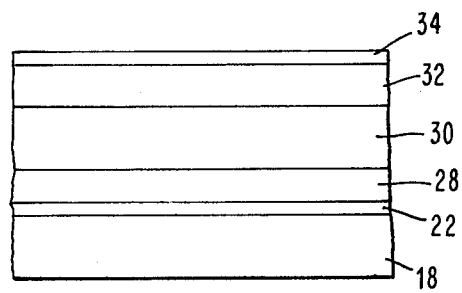
FIGS. 3A-3F illustrate the inventive fabrication process wherein extremely high quality, fine line patterns are provided without the need for thick resist layers.
Figure 3B:
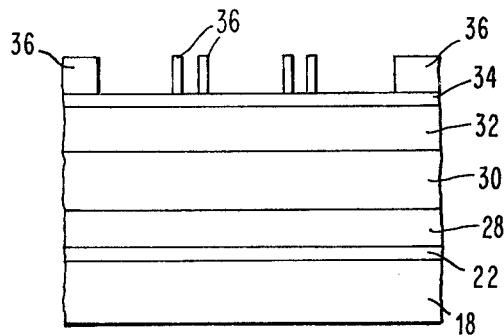

In FIG. 3A, a non-magnetic, electrically conductive layer 28 is deposited over the spacer layer 22. A magnetically soft material is deposited to form layer 30. For a bubble domain device such as that shown in FIG. 1, conductive layer 28 is typically about 2,000 Angstroms of evaporated gold (or Al-Cu), while layer 30 is typically about 3,000 Angstroms of sputtered amorphous magnetic material or permalloy (a trademark of the Allegheny-Ludlum Corporation). Of course, other materials can be used for these two layers, as is well known in the art. Layers 28 and 30 correspond to layers 24 and 26 of FIG. 2; that is, they will be patterned to form the T-bars 14 and I-bars 16, as well as current carrying conductors (not shown).

Although it is not shown in FIG. 3A, a thin (about 300 Å) layer of NiP is often deposited on the gold layer 28 prior to deposition of the NiFe layer 30. The NiP layer smooths the gold layer and enhances the magnetic properties of the NiFe layer.

Layer 32 is deposited on layer 30, and is the layer from which a mask will be formed for patterning of device metallurgy layers 28 and 30. In one embodiment, layer 32 is a thin layer of approximately 1500 Angstroms thickness. A suitable material for layer 32 is titanium (Ti), when the device metallurgy layers 28 and 30 are gold and NiFe respectively. Another potentially suitable masking material for layer 32 is chromium (Cr).

In the practice of this invention, the thin layer 32 will be patterned and used as a mask to define the device metallurgy. Since layer 32 is thin, precise patterning of the underlying layers 28 and 30 can be accomplished in order to provide fine line structures. Still further, layer 32 is chosen to be a material which does not etch as fast as the underlying layers 28 and 30, and for this reason only a thin layer 32 is required. In turn, this provides more precise patterns in the layers 28 and 30.

Layer 32 is patterned by an overlying mask. A plating base for this mask is typically comprised of a thin layer 34 of a material such as gold (Au). Layer 34 is about 400 Angstroms thick.

In FIG. 1B, a patterned layer 36 of positive resist, such as Poly Methyl Methacrylate (PMMA), has been formed on the plating base layer 34. Patterned layer 36 is typically 1,000–2,000 Angstroms in thickness and is comprised of a positive resist material. In this regard, substractive fabrication processes generally require negative resists, but in the present invention a positive resist such as PMMA can be used. Still further, the thickness of this resist layer is significantly less than that of the resist layers which have been used in the past to fabricate bubble devices having bubble domains of 1 micron and less in diameter. Resist layer 36 is patterned by conventional exposure techniques, such as direct electron beam exposure. Since the resist is very thin, optimum resolution for half-micron or smaller features can be obtained.

Figure 3C:
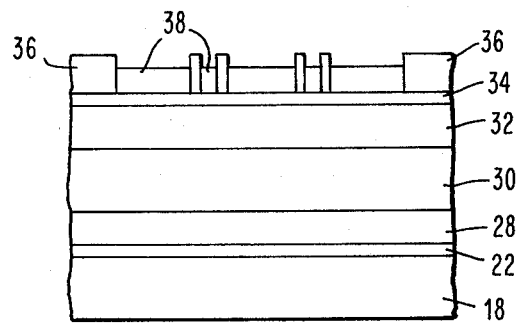

In FIG. 3C, a masking material 38 is plated onto plating base layer 34. The masking material 38 can be 500–1,000 Angstroms of NiFe plated through resist mask 36. Masking layer 38 will be used to pattern layer 32, which in turn will be used to pattern the device metallurgy.

Figure 3D:
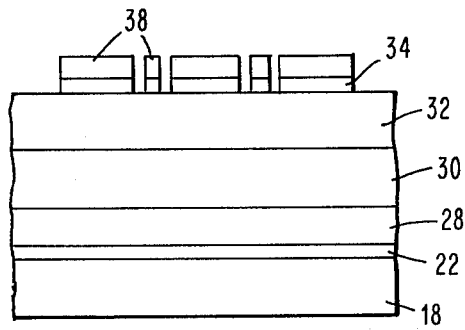

In FIG. 3D resist layer 36 is removed, and then the gold plating base layer 34 under resist layer 36 is removed by ion milling. Since gold layer 34 is only a few hundred angstroms thick, and since gold ion mills at a much higher rate than NiFe (ion milling ratio Au/NiFe=15/1 in oxygen), less than 40 Angstroms of NiFe mask layer 38 are removed during ion milling of the gold plating base 34. Accordingly, no loss of pattern acuity takes place during removal of portions of the plating base layer 34.

Patterned layer 38 is now used to pattern the titanium layer 32 so that it (Ti) can be used to pattern the actual device metallurgy (i.e., layers 28 and 30).

Figure 3E:
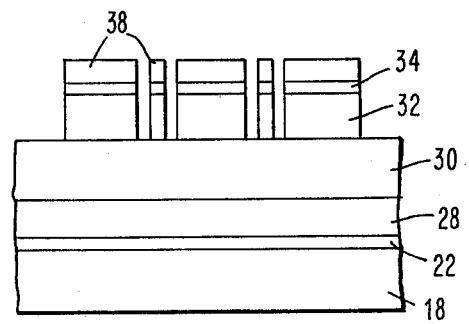

FIG. 3E illustrates the structure after Ti layer 32 is patterned. Layer 32 can be patterned by anisotropic reactive ion etching in pure $CF_4$, using masking layer 38. Reactive ion etching is known in the art, as is the apparatus used for this type of etching. For example, reference is made to H. W. Lehmann et al., Applied Physics Letters 32, (3) Feb. 1, 1978, p. 163. When $CF_4$ is used, the Ti layer 32 etches anisotropically, i.e., it is etched in a vertical direction to produce a mask having straight side walls. This etching process does not appreciably etch layer 38, and this is the reason why thin NiFe can be used for layer 38. In turn, this accounts for the fact that very thin positive resist can be used to plate layer 38. That is, since layer 38 can be very thin, only a thin resist layer 36 is required as an electroplating mask.

Since layer 38 is not a functional part of the finished device structure, its magnetic properties are unimportant. Other materials that can be used in place of NiFe for masking layer 38 include Ni, Cu and Fe. This material must etch by only a very small amount, or essentially not at all during the anisotropic reactive ion etching process used to define the pattern in layer 32, in order that layer 38 can be very thin. For example, the RIE rate of Ti in $CF_4$ is approximately 700 Å/min, while the etch rate of the NiFe mask under these same conditions has been measured to be 25 Å/min. Additionally, it must be a material that can be plated through a mask to provide a high resolution mask.

In the practice of this invention, it has been found to be necessary to provide masking layer 38 by electroplating through a mask. If masking layer 38 is deposited as a continuous layer and then patterned by ion milling through a resist mask, the high resolution needed for production of fine linewidth, small gap patterns will not be obtained.

Figure 3F:
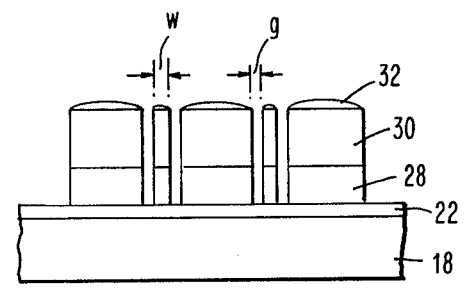

FIG. 3F shows the finished device structure in which layers 28 and 30 have been patterned, using the masking layer 32 as an ion milling mask. Since NiFe/Ti and Au/Ti have etch ratios of 8/1 and 30/1 respectively, when ion milled in oxygen, only about 1500 Angstroms of Ti is required. Because the masking layer 32 is as thin as this, steeper tilt angles can be used during the ion milling step which helps to preserve the integrity of the pattern as it is transmitted through layers 28 and 30.

Only residual amounts of Ti layer 32 remain after the device layers have been ion milled. That is, the initial thickness of the Ti layer 32 is chosen so that it is as thin as possible, allowing for complete ion milling of device layers 28 and 32. Since the etch rate of Ti with respect to NiFe and Au is as mentioned previously, the Ti layer can be very thin which leads to very good pattern acuity in the final device structure.

The electrically insulating, non-magnetic spacer layer 22 provides a spacer layer for the device structure and also protects the surface of the bubble domain film 18 during the ion milling step in which device layers 28 and 30 are patterned. However, layer 22 is not always necessary and may, in some applications, be omitted.

In the practice of this invention, the use of thin masks made of non-resist materials can be applied to different lithography procedures, including electron beam, x-ray, and optical lithography. Further, the bubble domain device structures to be patterned can comprise a plurality of device metallurgy layers as described herein. The advantage of the present method is even more pronounced when multiple device layers are to be patterned, since the total thickness of the multiple layers is such that conventional techniques cannot provide fine line patterns with high aspect ratios and good pattern acuity.

In the practice of this invention, the masking layer 32 is chosen with respect to its etch rate relative to the etch rates of the underlying device metallurgy layers. In the case of NiFe and Au layers, a masking layer comprising Ti is particularly suitable. In fact, Ti is the best ion milling mask regardless of the material comprising conductor layer 28. Another alternative is Cr, although this is not as favorable as Ti. In the same manner, NiFe is used as the masking layer 38 in order to pattern the underlying masking layer 32. NiFe is a suitable choice for this purpose because of its etch rate relative to that of Ti; that is, since the NiFe layer 38 is not adversely etched when Ti layer 32 is patterned, layer 38 can be very thin. Thus, the masking layers 38 and 32 are chosen with respect to both the etching process to be used to pattern layer 32 and the underlying materials to be patterned.

A patterned Ti or Cr layer is preferable as a masking layer for final device patterning. The difficult problem is to provide the ion milling mask (layer 32) in such a way that it has vertical side walls so that, when device layers 28 and 30 are patterned through it, faceting of the device layers will be minimized and the device pattern will have good acuity. Since Ti and Cr are not easily electroplated through a mask, and can't be patterned easily by a lift-off process, anisotropic reactive ion etching (anisotropic RIE) is used. In contrast with the prior art, a thin plated mask (38) is used for the RIE mask, rather than a thick resist mask. In turn, this alows the use of a very thin resist layer 36.

Although Ti metal masks have been used for patterning underlying layers in the past, most techniques for patterning Ti would have adverse affects on pattern acuity. Further, these prior techniques would adversely affect the underlying layers which are to be subsequently patterned to provide the device itself. Thus, the prior art techniques for patterning Ti, using ion milling, sputter etching, chemical etching, etc. adversely affect the finished device and do not provide good patterns in the Ti layer. This is avoided in the present invention by using the plated NiFe masking layer 38, which is very thin and which provides a successful mask for the anisotropic reactive ion etching step in which the Ti layer is patterned.

In summary, the present technique is a subtractive process which allows one to achieve high aspect ratio, fine line patterns in device metallurgy, and especially in devices using multiple metallization layers. Although the present invention can be used to make devices having larger line widths and gap sizes, the advantages of the process are then not as apparent, since other alternative processes will also yield good results. It is when the line width and gap sizes have to be made very small that conventional lithography techniques cannot be used. For instance, in order to make bubble domain devices having bubble diameters not in excess of about 1 micron, lithographic exposure by electron beams is required in order to resolve features having dimensions less than or equal to 0.5 micron. However, optimum resolution by electron beam lithography requires that the resist layers be as thin as possible. The prior art has not been able to provide processes using resist masks for this purpose. Thus, the problem area to be solved by the present invention is the environment which is critical to the claimed process.

It is to be understood that the principles of the present invention will enable those of skill in the art to provide variations thereof which are consistent with these principles.

Having thus described our invention, what we claim as new, and desire to secure by Leters Patent is:

1. A method for fabricating a bubble domain device, comprising the steps of:
   depositing a first continuous device layer of electrically conductive, non-magnetic material on a substrate comprising a magnetic film in which bubble domains can be moved,
   depositing a second continuous device layer of magnetically soft material on said first layer,
   depositing a thin first masking layer of a material which etches less rapidly than the materials comprising said first and second device layers onto said second device layer,
   forming a thin patterned second masking layer over said first masking layer using a thin resist layer of thickness less than the thickness of either of said first and second device layers,
   patterning said first masking layer by etching said first masking layer through said patterned second masking layer,
   producing magnetic propagation elements which are separated from each other by gaps of 0.5 micron and less by patterning said first and second device layers by etching said device layers through said patterned first masking layer to form said bubble domain device, portions of said second device layer being patterned to provide magnetic propagation elements for moving said bubbles in said magnetic film.

2. The method of claim 1, where the thickness of said first masking layer is less than the thickness of either of said first and second device layers.

3. The method of claim 1, where said resist is a positive resist layer.

4. The method of claim 1, where said first masking layer is comprised of a material selected from the group consisting of titanium and chromium, said second masking layer is comprised to a material selected from the group consisting of NiFe, Ni, Cu, and Fe, said first device layer is comprised of a material selected from the group consisting of gold and Al-Cu, and said second device layer is comprised of NiFe.

5. The method of claim 1, where said device layers are patterned to provide said propagation elements, said etching producing propagation elements having linewidths not in excess of about 1 micron.

6. A method for producing a magnetic bubble domain device, comprising the steps of:
   depositing at least one device layer comprising a magnetic material on a substrate comprising a magnetic film in which bubble domains can be moved,
   providing a first masking layer over said at least one device layer, said first masking layer being comprised of a material which etches at a rate less than the etch rate of said at least one device layer in a given etching process,
   forming a thin positive resist mask over said first masking layer,
   plating a second masking layer through said thin resist mask
   removing said thin resist mask,
   etching said first masking layer through said second masking layer to produce a pattern therein having a minimum resolvable feature less than about 1 micron,
   etching said at least one device layer through said patterned first mask layer to reproduce said pattern in said at least one device layer, where the minimum resolvable feature in said at least one device layer is less tha about 1 micron.

7. A method for producing a magnetic bubble domain device, comprising the steps of:

depositing first and second device layers on a substrate comprising a magnetic film in which bubble domains can be moved, said first device layer being comprised of an electrically conductive, non-magnetic material and said second device layer being comprised of a magnetically soft material, providing a first masking layer over said first and second device layers, said first masking layer being comprised of a material which etches at a rate less than the etch rates of said first and second device layers in a given etching process, forming a thin plating base layer over said first masking layer, forming a thin positive resist maask on said plating base, plating a second masking layer through said thin resist masking layer to a thickness which is less than the thickness of said first or second device layers, removing said resist layer and said plating base layer where the plating base layer is not protected by the material comprising said second masking layer, etching said first masking layer through said second masking layer to produce a pattern therein having a minimum resolvable feature less than about 1 micron, etching said first and second device layers through said patterned first mask layer to reproduce said pattern in said first and second device layers, where the minimum resolvable feature in said first and second device layers is less than about 1 micron.

8. The method of claim 7, where said resist layer is comprised of an electron beam sensitive material.

9. The method of claim 7, where said first device layer is comprised of a material selected from the group consisting of gold and Al-Cu, said second device layer is comprised of a material selected from the group consisting of amorphous magnetic materials and NiFe, said first masking layer is comprised of a material selected from the group consisting of Cr and Ti, and said second masking layer is comprised of a material selected from the group consisting of Ni, Cu, Fe and NiFe.

10. The method of claim 7, where the thickness of said resist layer is less than about 2,000 Angstroms.

11. The method of claim 10, where said second masking layer is electroplated to a thickness not in excess of about 2000 A, and said first masking level is deposited to a thickness not in excess of the thicknesses of said first and second device layers.

12. The method of claim 7, where said first masking layer is a metallic material.

13. The method of claim 12, where said first masking layer is etched by anisotropic reactive ion etching, and said first and second device layers are etched by ion milling.

14. The method of claim 13, where the material comprising said second masking layer is one which etches negligibly during the reactive ion etching step used to pattern said first masking layer.

15. A method for producing a magnetic bubble domain device, comprising the steps of:

depositing first and second device layers on a substrate comprising a magnetic film in which bubble domains can be moved, said first device layer being comprised of an electrically conductive, non-magnetic material and said second device layer being comprised of a magnetically soft material, providing a first masking layer over said first and second device layers, said first masking layer being comprised of a material which etches at a rate less than the etch rates of said first and second device layers when said first and second device layers are etched through said first masking layer, forming a thin positive resist mask over said first masking layer, plating a second masking layer through said thin resist mask to a thickness which is less than the thickness of said first or second device layers, removing said resist mask, etching said first masking layer through said second masking layer by anisotropic reactive ion etching in $CF_4$ to produce a pattern therein having a minimum resolvable feature of about 1 micron or less, etching said first and second device layers by ion milling through said patterned first masking layer or reproduce said pattern in said first and second device layers, where the minimum resolvable feature in said first and second device layers is about 1 micron or less.

16. The method of claim 15, where said first masking layer is comprised of a material selected from the group consisting of Ti and Cr, and said second masking layer is comprised of a material selected from the group consisting of Ni, Cu, Fe, and NiFe.

17. The method of claim 16, where the thickness of said resist mask is less than about 2,000 Angstroms.

* * * * *